United States Patent [19]

Sasaki et al.

[11] Patent Number: 5,770,095
[45] Date of Patent: *Jun. 23, 1998

[54] POLISHING AGENT AND POLISHING METHOD USING THE SAME

[75] Inventors: Yasutaka Sasaki, Kawasaki; Nobuo Hayasaka, Yokosuka; Hisashi Kaneko, Fujisawa; Hideaki Hirabayashi, Tokyo; Masatoshi Higuchi, Kawasaki, all of Japan

[73] Assignee: Kabushiki Kaisha Toshiba, Kawasaki, Japan

[*] Notice: The term of this patent shall not extend beyond the expiration date of Pat. No. 5,575,885.

[21] Appl. No.: 500,753

[22] Filed: Jul. 11, 1995

[30] Foreign Application Priority Data

Jul. 12, 1994 [JP] Japan ................................. 6-159898
Mar. 15, 1995 [JP] Japan ................................. 7-055290

[51] Int. Cl.$^6$ .......................... H01L 21/00; C23F 1/00; B44C 1/22
[52] U.S. Cl. ........................ 216/38; 216/103; 216/105; 438/633; 438/692; 438/693
[58] Field of Search .................................. 216/103, 105, 216/101, 108, 38; 438/633, 692, 693; 252/79.4

[56] References Cited

U.S. PATENT DOCUMENTS 4,251,384 2/1981 Rooney ................................. 216/103
4,954,142 9/1990 Carr et al. .
4,956,313 9/1990 Cote et al. .
5,575,885 11/1996 Hirabayashi et al. ............... 156/626.1

OTHER PUBLICATIONS

Materials Research Society Symposium Proceedings, vol. 337, Apr. 4–8, 1994, pp. 133–138, J.M. Steigerwald, et al., "Surface Layer Formation During The Chemical Mechanical Polishing of Copper Thin Films".

*Primary Examiner*—Thorl Chea
*Attorney, Agent, or Firm*—Oblon, Spivak, McClelland, Maier & Neustadt, P.C.

[57] ABSTRACT

The present invention provides a polishing method including the steps of forming a film made of material containing a metal as a main component over a substrate having depressed portions on a surface thereof so as to fill the depressed portions with the film, and polishing the film by a chemical mechanical polishing method using a polishing agent containing a chemical agent responsible for forming a protection film on a surface of the film by reacting with the material containing a metal as a main component, thereby forming a conductive film in the depressed portions. The present invention also provides a polishing agent, which is used in forming a film made of material containing a metal as a main component in depressed portions of a substrate having depressed portions on a surface thereof by using a chemical mechanical polishing method, including a chemical agent responsible for forming a protection film on the surface of a substrate to be polished by reacting with the material containing a metal as a main component.

15 Claims, 7 Drawing Sheets

POLISHING AGENT AND POLISHING METHOD USING THE SAME

BACKGROUND OF THE INVENTION

1. Field of the Invention

The present invention relates to a polishing agent and a polishing method, and more specifically to a polishing agent for use in a micro-processing step such as a semiconductor-device manufacturing step and a polishing method using such a polishing agent.

2. Description of the Related Art

In recent years, various micro-processing techniques have been studied to develop highly integrated LSIs and high-performance LSIs. A chemical mechanical polishing method (hereinafter, referred to simply as "CMP") is one of the techniques under study to satisfy stringent requirements for attaining the micro-processing. The CMP method is also a technique indispensable for the semiconductor-device manufacturing process, particularly in a multi-layered wiring formation step including steps of forming a planar interlayer insulating film, metal plugs and buried wiring portions. The CMP method is proposed by, for example, C. W. Kaanta, et al. and K. D. Beyer et al.(VMIC Conference 1991, p.144, C. W. Kaanta et al.; U.S. Pat. No. 4944836 Beyer et al.).

To manufacture high-speed LSI, attention has been drawn to the fact that Cu has lower resistivity than that of Al conventionally-used in an upper-layer wiring portion, and the possibility of Cu as a novel wiring material has been investigated. However, Cu is very difficult to process by reactive-ion etching, so that a buried-wiring formation method using the CMP method has been studied to employ Cu as a wiring material. The buried wiring formation method is disclosed in, for example, Jpn. Pat. Appln. KOKAI Publication No.2-278822 and the like. This KOKAI Publication discloses a method in which a Cu film is polished with a polishing slurry consisting of polishing grains, a chelate compound of transition metal and a solvent for the compound.

However, to polish a Cu film at a high rate without scratches in accordance with the buried wiring formation method mentioned above, the Cu etching rate must be raised by increasing the amount of the component responsible for Cu etching contained in the polishing slurry. If the component is used in an increased amount, the etching will proceed isotropically. Consequently, buried Cu is etched away, causing dishing in the wiring. Thus, it is difficult to form a highly reliable LSI wiring made of Cu.

Similarly, if the CMP method is applied to the formation of tungsten (W) wiring, dishing will occur. A highly reliable LSI wiring made of W is also difficult to obtain. In addition, when the CMP method is employed to form tungsten (W) wiring, the polishing rate decreases.

SUMMARY OF THE INVENTION

The present invention has been made in view of the above-mentioned problems and aims to provide a polishing agent capable of forming a highly reliable conductive film at a high polishing rate while suppressing the occurrence of dishing, and also aims to provide a polishing method using the polishing agent.

The present invention provides a polishing method comprising the steps of forming a film made of material containing a metal as a main component on a substrate having depressed portions on the surface so as to fill the depressed portions with the film; and polishing the film by a chemical mechanical polishing method using a polishing agent containing a chemical agent responsible for forming a protection film on the surface of the film by reacting with the material containing a metal as a main component, thereby forming a conductive film in the depressed portions.

The present invention also provides a polishing agent, which is used in forming a film made of the material containing a metal as a main component in the depressed portions of a substrate having depressed portions in the surface thereof by the chemical mechanical polishing method, and which comprises a chemical agent responsible for forming a protection film on the surface of the substrate to be polished by reacting with the material containing a metal as a main component.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

When buried metal wiring portions, via holes or contact holes are formed by polishing a substrate having depressed portions and protruding portions, it is of general importance that the protruding portions are exclusively polished so as to leave a desired film only in the depressed portions. If mechanical polishing alone is applied to the substrate, the desired film is allowed to remain only in the depressed portions with high efficiency, ensuring a high selective ratio. However, since the mechanical polishing has a disadvantage of a low polishing rate, throughput required in a semiconductor device manufacturing step cannot be ensured. In contrast, if chemical polishing alone is used, a desired film fails to remain in the depressed portions only, since etching proceeds isotropically even though the polishing rate is high. In view of the aforementioned advantages and disadvantages, the present inventors made intensive studies on chemical mechanical polishing (CMP), which is a combination method of the mechanical polishing and chemical polishing. As a result, they elucidated components responsible for the mechanical polishing and chemical polishing. Based on this study, the present inventors found that isotropic chemical polishing can be suppressed if a protection film is formed on a target film by CMP using a polishing agent containing a chemical agent specific to the material of the target film, and that the protection film thus formed is easily removed from the protruding portions only, by the mechanical polishing, thereby forming a highly reliable conductive film. On the basis on the above-findings, they accomplished the present invention.

Examples of the substrates to be used in the present invention include a silicon substrate, a glass substrate for TFT-LCD, a substrate made of a compound semiconductor such as GaAs and the like. The depressed portions of the substrate surface are used as buried metal wiring portions, via holes or contact holes.

Examples of the materials containing a metal as a main component include those containing Cu, Cu alloy, Ag, Ag alloy, Al, Al alloy, W, W alloy, oxides of these metals (and alloys), and the like. These metals may be contaminated with a little amount of impurities and additional element(s).

Examples of the chemical agents forming a protection film by reacting with the aforementioned material containing a metal as a main component include benzotriazole (hereinafter, referred to as "BTA"), BTA derivatives including tryltriazole (TTA) which is prepared by substituting a hydrogen atom of a benzene ring of BTA with a methyl group, a mixture containing the aforementioned compounds, thiourea, azole (in particular, benzimidazole), triazole, salicylaldoxime, cupferron, ethylenediamine, amino acids containing sulfur (in particular, cysteine), p-aminobenzaldehyde, a halo acetic acid, thiols such as phosphonic acids (e.g., dodecylmercaptan and octanephosphonic acid), monosaccharides such as a glucose and a fructose, derivatives and mixtures of the above-mentioned compounds, N-benzoyl-N-phenylhydroxyamine (hereinafter, referred to as "BPA"), BPA derivatives, and the like.

As a chemical agent to be used in the present invention, a hydrophobic organic compound having a hydrophobic portion is preferable. BTA, a BTA derivative such as a BTA derivative prepared by substituting a hydrogen atom of a BTA benzene ring with a methyl group, and a mixture containing the aforementioned compounds are particularly effective when Cu or a Cu alloy is employed as the material containing a metal as a main component. In contrast, BPA, a BPA derivative and a mixture thereof are particularly effective when W or a W alloy is employed as the material containing a metal as a main component.

The etching agent for the material containing a metal as a main component may be appropriately selected in accordance with the material. For example, the etching agent containing an aminoacetic acid such as glycine, amidosulfuric acid or mixed acids of these compounds, and an oxidizing agent such as hydrogen peroxide ($H_2O_2$), nitric acid, hypochlorous acid, or ozone water may be used. Another etching agent may be used which is an aqueous solution of nitric acid, ammonia, ammonium salts such as ammonium persulfate, ammonium nitride or an ammonium chloride, and an chromic acid. These etching agents are particularly preferable to be used when Cu or a Cu alloy is employed as the material containing of a metal as a main component.

Etching solutions used in the case where W or a W alloy is employed as the material containing a metal, are an aqueous hydrogen peroxide solution, an aqueous iron nitride solution, a mixed aqueous solution of potassium ferricyanide and ethylendiamine, a mixed aqueous solution of potassium ferricyanide and phosphoric acid, and the like.

The protection film formed by the reaction between the material containing a metal as a main component and a chemical agent preferably contains a metal chelate compound or a complex compound.

In the present invention, CMP may be carried out in one step using a polishing agent containing the aforementioned chemical agent and etching agent. Alternatively, CMP may be carried out in two-steps: the first step is carried out using a polishing agent containing the aforementioned etching agent without a chemical agent and the second step is performed using a polishing agent consisting of the polishing agent used in the first step and a chemical agent. In the latter two-step CMP method, the polishing agents are added using a plurality of nozzles. To explain more specifically, the first polishing agent is supplied via a nozzle different from the second polishing agent supply nozzle. Alternatively, the second polishing agent is prepared on a polishing table by supplying a solution containing a chemical agent via a nozzle different from the first polishing agent supply nozzle, or via a supply inlet provided to the polishing table.

In the present invention, the polishing rate can be increased by heating a portion of the film to be polished, which is exposed to the polishing agent since many of the components in the polishing agent are responsible for the chemical polishing.

To achieve the aforementioned polishing method, the present invention provides a polishing agent containing a chemical agent responsible for forming a protection film on the surface of a film made of the material containing a metal as a main component by reacting with the material, and containing an etching agent consisting of the aforementioned material(s). It is preferred that the polishing agent herein should contain an aminoacetic acid and/or an amidosulfuric acid, an oxidizing agent, water, and benzotriazole or a derivative thereof.

The present invention comprises the steps of forming a film consisting of material containing a metal as a main component on a substrate having depressed portions on the surface thereof, so as to fill the depressed portions with the film and polishing the aforementioned film by the chemical mechanical polishing method using a polishing agent containing a chemical agent responsible for forming a protection film on the surface of the film by reacting with the material containing a metal as a main component, and containing an etching agent for the material containing a metal as a main component, thereby forming a conductive film in the depressed portions.

Hereinbelow, the function of the present invention will be explained by way of example with reference to the case of employing a Cu series material (as the material containing a metal as a main component) and BTA (as the chemical agent).

When BTA is exposed to a Cu film, Cu on the Cu film surface, or CuO or $Cu_2O$ which is a naturally oxidized film formed on the Cu film, reacts with BTA, thereby forming a secure film made of a Cu chelate compound represented by Cu (I)-BTA or Cu (II)-BTA, on the Cu film or the naturally oxidized film. The film thus formed functions as a protection film to suppress oxidization or corrosion (of the Cu film) in an atmosphere or in a solution capable of eating away Cu, that is, in the presence of an etching agent having a chemical corrosion range in which Cu can be etched at a high rate. The protection film can be easily and uniformly removed by physical and mechanical exposure to polishing grains or a polishing pad during CMP. It is conventionally known that such a protection film suppresses oxidation or corrosion of Cu. However, the present inventors for the first time discovered the fact that the protection film can be removed easily and uniformly through physical and mechanical exposure to polishing grains or a polishing pad during CMP.

Figure 2A:
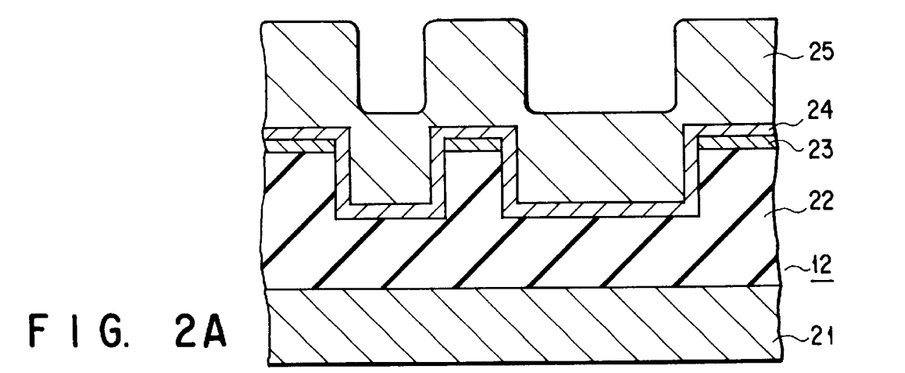
FIGS. 2A, 2B, and 7A, 7B are sectional views explaining Examples of the polishing method of the present invention.
Figure 2B:
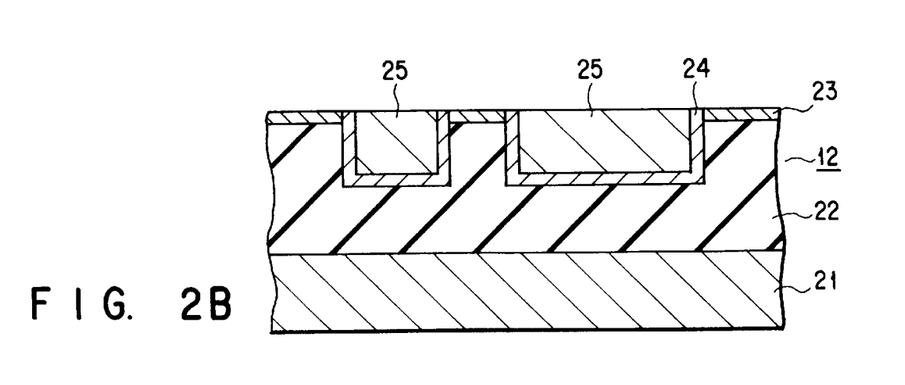

The protection film can be formed over the entire surface of a Cu film 25 shown in FIG. 2A. The protection film formed on protruding portions can be easily removed by being exposed to polishing grains or a polishing pad. The thus-exposed Cu film 25 on the protruding portions can be eaten away by an etching agent at a high rate. At this time, the Cu film 25 charged in the depressed portions is hardly etched since the protection film is formed on the surface. Consequently, the difference in height between the protruding portions and the depressed portions of the Cu film reflecting the similarly formed portions of the substrate decreases. Thereafter, the protection film formed on Cu film 25 charged in depressed portions is removed by being exposed to polishing grains or a polishing pad. The Cu film 25 at this stage no longer has a difference in height. Even if the Cu film 25 deposited in the depressed portions is etched further, dishing will not occur. Likewise, the Cu film 25 can be polished at a high rate and successively remains in the depressed portions with high efficiency.

Examples of methods for removing the protection film include a method in which the film is exposed to polishing grains or a polishing pad, a method in which a brush made of metal or resin is exposed to the film, and a method in which a polishing agent is blown upon the film at a predetermined pressure.

On the other hand, the same explanation mentioned above can be repeated in the case where a W-series material (as a material containing a metal as a main component) and BPA (as a chemical agent) are used. To be more specific, when BPA is exposed to the W film, W or WOx reacts with BPA to form a secure film made of a W chelate compound represented by W-BPA on the W film. The film thus-formed functions as a protection film suppressing oxidization or corrosion of the W-film in an atmosphere or in a solution capable of eating away W, that is, in the presence of an etching agent having a chemical corrosion range in which W can be etched at a high rate. The protection film can be easily and uniformly removed by physical and mechanical exposure to polishing grains or a polishing pad during CMP.

Hereinafter the present invention will be explained with reference to the drawings.

(EXAMPLE 1)

Figure 1:
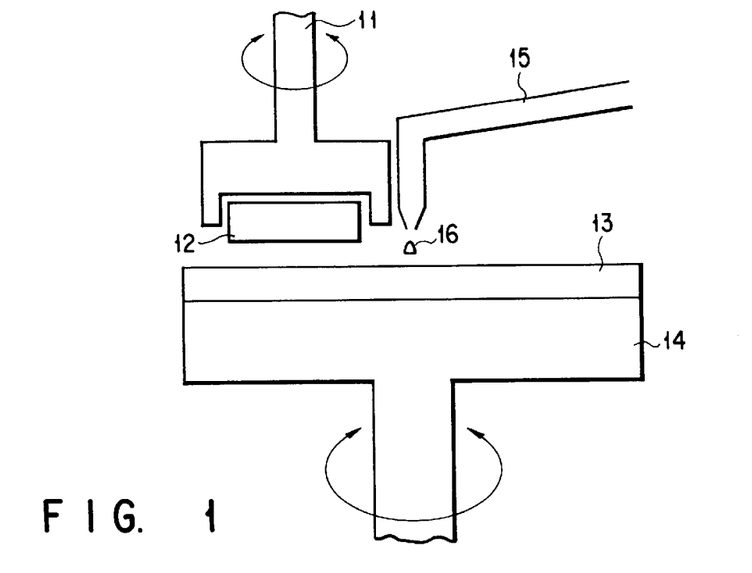
FIG. 1 is a schematic view explaining a polishing apparatus to be used in the polishing method of the present invention.

FIG. 1 is a schematic view showing a polishing apparatus used in this Example of the present invention.

Reference numeral 11 in FIG. 1 denotes a rotatable vacuum-chuck holder. To the vacuum-chuck holder 11, a substrate 12 to be polished is vacuum-chucked in such a way that the surface of the substrate 12 is opposed to a polishing pad 13. The polishing pad 13 is mounted on a rotatable polishing table 14 disposed underneath of the vacuum chuck holder 11. An exhaust port of a polishing agent supply pipe 15, which is connected to a polishing agent tank (not shown), is extended near a polishing pad 13. The polishing agent supply pipe 15 comprises a means for controlling a supply of a polishing agent 16. As a polishing pad, a material made of resin-impregnated nonwoven fabric was used.

FIG. 2A is a sectional view of the substrate 12 to be polished, used in this Example. This substrate 12 was formed as follows: First, over a silicon substrate 21, a silicon oxide film 22 was formed in a thickness of approximately 1 $\mu$m. Over the silicon oxide film 22, a carbon film 23 having a thickness of approximately 10 nm was formed by a direct-current magnetron sputtering method. Next, these films 22 and 23 were subjected to a customary photolithography process and reactive-ion etching process to pattern them, thereby forming wiring trenches having a width of 0.4 to 10 $\mu$m and a depth of 0.4 $\mu$m, and opening holes for connecting wires in the silicon oxide film 22. Thereafter, a titanium nitride film 24 having a thickness of 50 nm and subsequently a Cu film 25 having a thickness of approximately 600 nm were formed by the direct-current magnetron sputtering method. The Cu film 25 before subjecting to CMP had protruding portions and depressed portions, reflecting the similarly formed portions of the substrate, i.e., the silicon oxide film 22, as shown in FIG. 2A.

The substrate 12 thus-formed was subjected to CMP using a polishing apparatus shown in FIG. 1. After unnecessary Cu film 25 other than that placed in wiring trenches and opening holes for connecting wires was removed, buried Cu-wiring portions and Cu plugs were formed.

The polishing agent used in CMP was prepared by dispersing silica particles (polishing grains) having an average particle size of 30 nm (5.3 wt.%) in a mixed solution (an Cu etching solution) of 0.12 mole/l aqueous glycine ($C_2H_5O_2N$) solution and 0.44 mole/l aqueous hydrogen peroxide ($H_2O_2$) solution, followed by adding 0.001 mole/l benzotriazole, ($C_6H_5N_3$) serving as the chemical agent thereto. Polishing was performed at a polishing pressure of 300 gf/cm$^2$ by setting the revolution rates of the polishing table 14 and vacuum chuck holder 11 to 100 rpm while the temperature of the polishing table was maintained at a constant temperature of 25° C.

As a result, the CMP polishing was carried out at an extremely high rate of approximately 120 nm/min. In order to form the buried Cu-wiring portions and Cu plugs, it was necessary to remove not only the Cu film 25 but also the titanium nitride film 24 of protruding portions of the Cu film 25. The polishing rate of the titanium nitride 24 was approximately 30 nm/min, lower than the polishing rate for the Cu film 25. However, when the Cu film 25 was polished deeper than the Cu film 24, the Cu film 25 was depressed compared to the titanium nitride film 24. At this time, a protection film was formed over the surface of the Cu film 25 of the depressed portions, so that the Cu film 25 was no longer polished. In this way, the titanium nitride 24 was successively removed. After completion of CMP, the surfaces of the buried Cu-wiring portions and Cu plugs were observed by a scanning electron microscope. No scratches were observed thereon in this CMP process.

Since the Cu surface was exposed to water during the CMP process, Cu, CuO, $Cu_2O$, and Cu(OH)x were presumably present in a mixed state on the surface of the Cu film 25. However, a protection film was formed since BTA made a chelate compound with any one of the substances present in the Cu surface.

Figure 3:
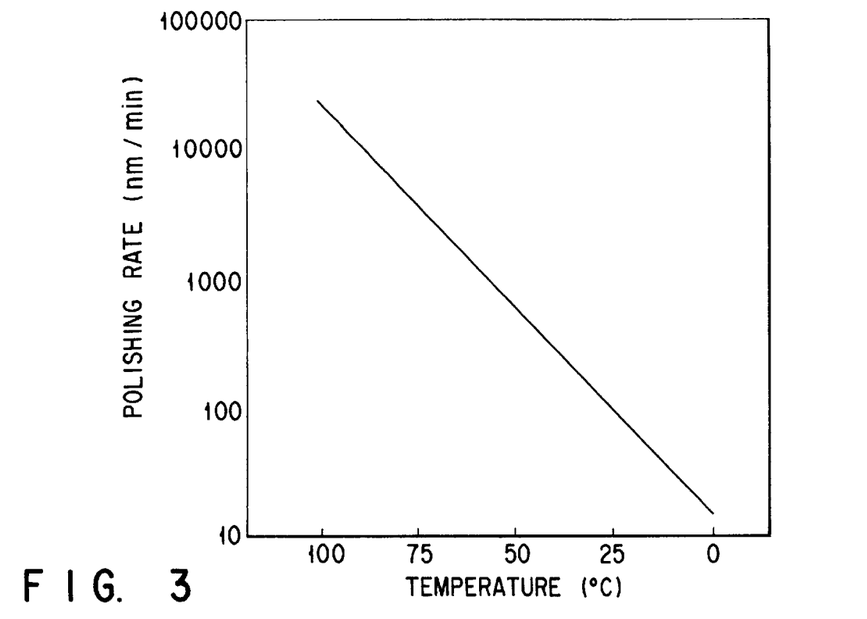
FIG. 3 is a graph showing the relationship between the polishing temperature and polishing rate in the polishing method of the present invention.

Using a polishing agent containing BTA, we checked the dependency of Cu polishing rate on temperature. At this time, the Cu film was polished at a pressure of 400 gf/cm$^2$. The polishing table and vacuum chuck holder were rotated at a rate of 60 rpm. The logarithms of the polishing rates were plotted on the axis of ordinates and the inverse numbers (1/T) of the temperatures were plotted on the axis of abscissa. The results are shown in FIG. 3. As is apparent from FIG. 3, the inverse numbers of temperatures plotted relative to the polishing rates exhibit a straight line having a negative gradient in the range of approximately 0° C. to 100° C. From these results, it is presumed that the polishing rate is controlled by a certain chemical reaction caused during CMP and hardly influenced by physical and mechanical factors. This means that the protection film formed over the surface of the Cu film 25 can be easily removed by a physical and mechanical activity using polishing grains or a polishing pad in the CMP process.

Figure 4:
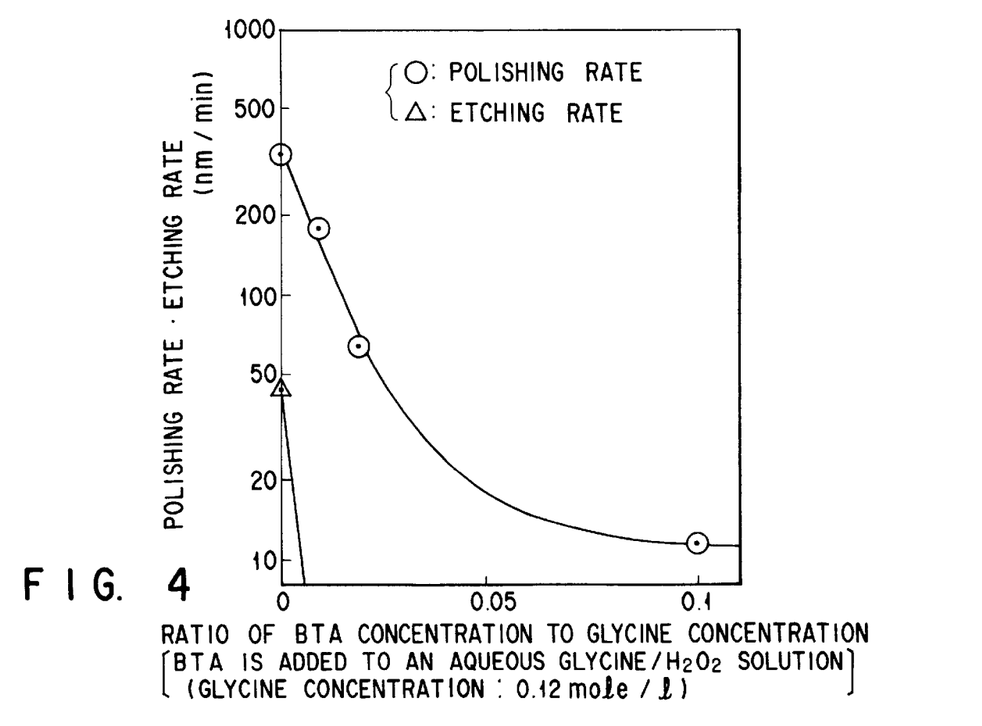
FIG. 4 is a graph showing the change in the polishing rate and etching rate relative to the addition amount of BTA in the polishing method of the present invention.

On the other hand, we investigated the change in the polishing rate and etching rate relative to the addition amount of BTA. The results are shown in FIG. 4. In FIG. 4, the axis of the abscissa expresses the addition amount of BTA relative to glycine (0.12 mole/l), and the axis of the ordinate expresses a polishing rate and an etching rate. As is apparent from FIG. 4, in the case where BTA is not added, the polishing rate is as high as approximately 350 nm/min and the etching rate is as high as approximately 45 nm/min. As the amount of BTA increases, both the polishing rate and etching rate decrease exponentially. However, the polishing rate is supposed to be almost saturated at 0.1 mole/l of BTA. The amount of BTA necessary for protecting the Cu film 25 is found to be as small as 0.001 mole/l or less.

Figure 5:
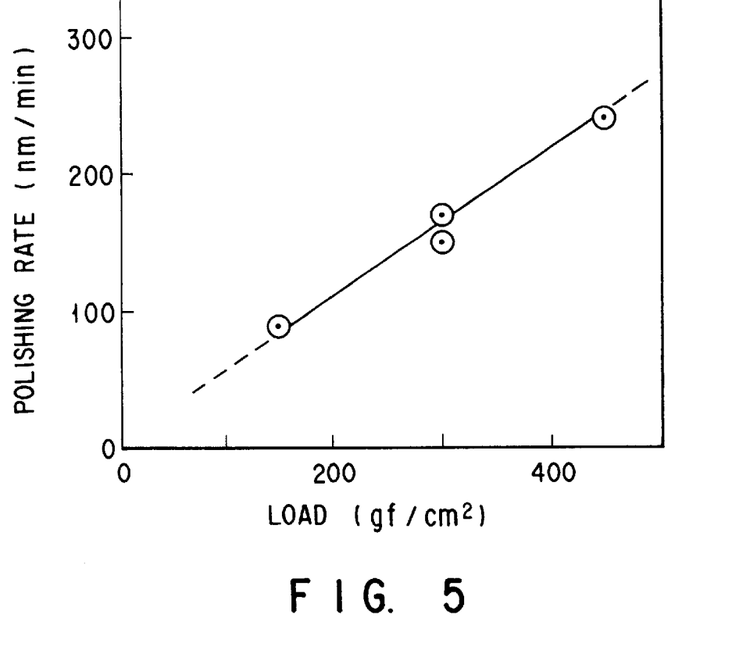
FIG. 5 is a graph showing the relationship between the polishing pressure and polishing rate in the polishing method of the present invention.

We checked the dependency of polishing rate on pressure (loading), using a polishing agent containing BTA in an amount of 0.001 mole/l. At this time, the polishing table was maintained at a constant temperature of 25° C. and each of revolution rates of the polishing table and vacuum chuck holder was set to 60 rpm. The results are shown in FIG. 5. As is apparent from FIG. 5, the polishing rate is proportional to the polishing pressure. The straight line seems to pass the origin of the coordinate axes. To be more specific, the polishing rate seems to be rate-determined by the polishing pressure in the range of the polishing pressure used in the generally-used CMP. In other words, the polishing rate is rate-determined by the rate at which the protection film on the surface of the Cu film 25 is removed depending on physical-mechanical function. Hence, the polishing rate can be raised to a value of the polishing rate at relative to each temperature shown in FIG. 3, by increasing the polishing pressure.

Figure 6:
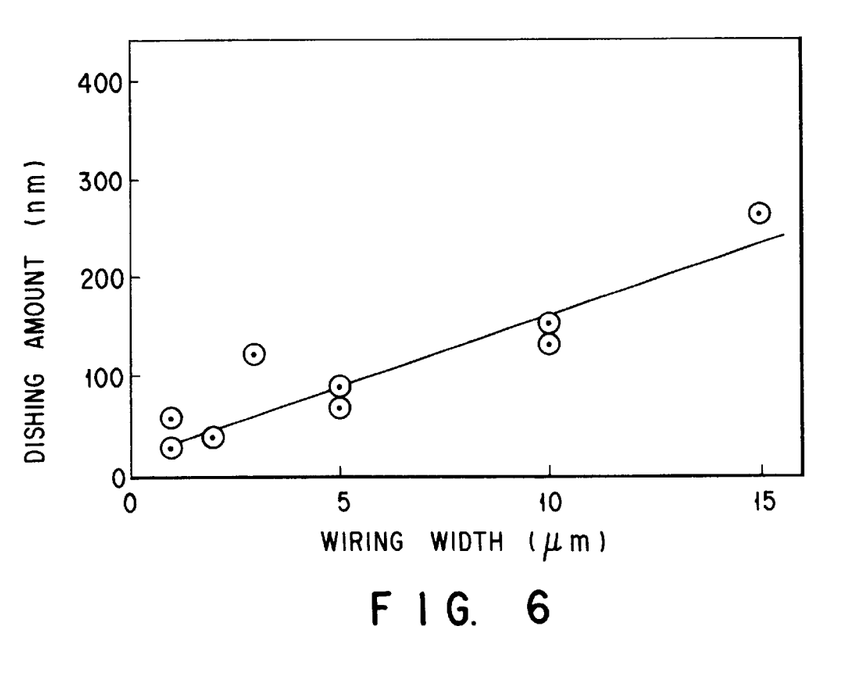
FIGS. 6, 8, 11, and 14 are graphs showing the relationship between the wiring width and the dishing amount in the polishing method of the present invention.

We checked the dependency of dishing amount upon the wiring width. The results are shown in FIG. 6. The polishing was regarded as having been completed at the time when the Cu film 25 and titanium nitride film 24 on the protruding portions were completely removed. As is apparent from FIG. 6, the dishing value of the buried Cu-wiring portions is approximately 150 nm at the central portion of the wiring of 10 μm in width. This dishing value was practically acceptable. When the polishing time was further extended, the dishing value hardly increased. Taking this fact into consideration, it can be determined that the protection film formed over the Cu film 25 effectively functions.

In this Example, we explain the case where a Cu film was polished but a similar effect can be obtained even if use is made of a Cu film contaminated with a small amount of impurities and additional elements, a film made of metal other than Cu, such as Ag, Al, or W, or a film consisting of any one of the aforementioned metals as a main component.

In this Example, we explain the cases where silica grains alone were used as the polishing grains but a similar effect can be obtained even if use is made of grains having a equal to or greater hardness as that of silica grains such as alumina grains, titanium oxide grains, zirconium oxide grains, cerium grains, silicone carbide grains, and diamond grains.

In this Example, we explain the case where a mixed solution of an aqueous glycine solution and an aqueous hydrogen peroxide solution was used as an etching agent and BTA as a chemical agent, but a similar effect can be obtained even if use is made of an etching agent consisting of a mixed acid (an amidosulfuric acid+an aminoacetic acid) and an oxidizing agent such as hydrogen peroxide ($H_2O_2$), nitric acid, hypochlorous acid, or ozone water, or if use is made of ammonium nitride, ammonium chloride, or chromic acid. Furthermore, a similar effect can be obtained even if as the chemical agent specific to a film material to be etched, use is made of an agent capable of forming a chelate compound or a complex with the film material, such as various BTA derivatives, a mixture containing various BTA derivatives, thiourea, thiourea derivatives, cupferron, benzimidazole, triazole, salicylaldoxime, ethylenediamine, cysteine, p-aminobenzaldehyde, halo acetic acid, dodecylmercaptan phosphonic acids, or monosaccharides including a glucose and a fructose. BTA or a BTA derivative is particularly effective when used together with an aqueous sulfuric acid solution or an aqueous hydrochloric acid solution.

In this Example, a polishing pad consisting of resin-impregnated nonwoven fabric was used but any polishing pad may be used as long as it has the same degree of hardness as that of the polishing pad used in the present invention. For example, a pad made of nonwoven fabric such as polyester or polyether and an expanded polyurethane pad may be used. Two or more different non woven fabrics can be adhered to form a pad. It should be noted that as the BTA derivative mentioned above, a BTA derivative whose hydrogen portion is substituted by an alkyl group is particularly preferable.

(Comparative Example 1)

CMP was applied to the substrate 12 to be polished shown in FIG. 2A in the same manner as in Example 1 except that use was made of a polishing agent prepared by dispersing silica grains (polishing grains) having an average diameter of 30 nm (5.3 wt%) in a mixed solution (Cu etching solution) of 0.12 mole/l aqueous glycine solution and 0.44 mole/l aqueous hydrogen peroxide solution. In other words, the polishing agent was the same polishing grains used in Example 1 except that BTA was not added.

As a result, CMP was carried out at a rate as high as approximately 250 nm/min. However, the dishing amount was extremely large compared to that obtained in Example 1. To be more specific, the dishing amount in a wiring trench having a minimum wiring width, namely, 0.4 μm wiring width was approximately 300 nm. The Cu film almost disappeared in the wiring trench having a wiring width of 5 μm or more. When the polishing is further continued, the Cu film in the wiring trenches and opening holes for connecting wires entirely disappeared.

(EXAMPLE 2)

Figure 7A:
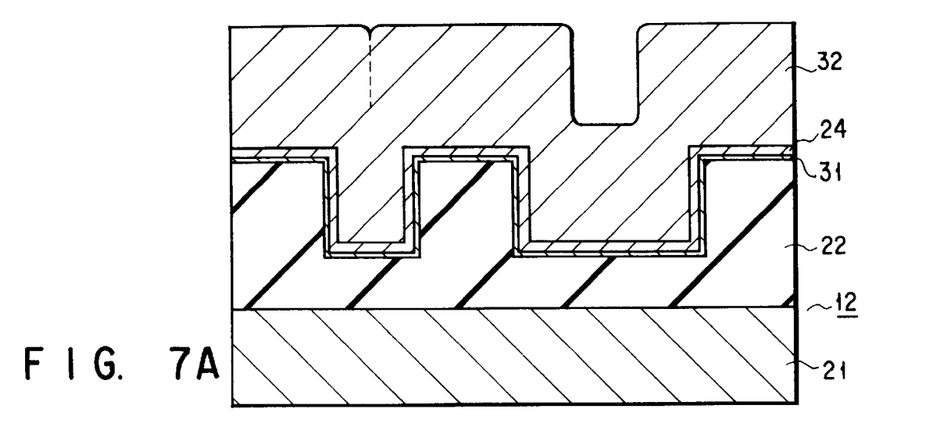
Figure 7B:
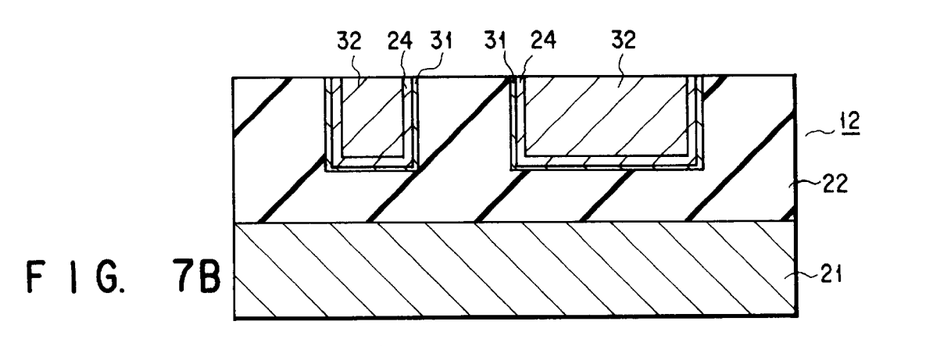

FIG. 7A is a sectional view of a substrate 12 to be polished, used in this Example. The substrate 12 was prepared as follows: First, a silicon oxide film 22 having approximately 1 μm in width was formed over a silicon substrate 21. Subsequently, the silicon oxide film 22 was subjected to a customary photolithography process and reactive-ion etching process to pattern it, thereby forming wiring trenches of 0.4 to 10 μm in thickness and 0.4μ in depth and opening holes for connecting wires. Thereafter, a titanium film 31 of approximately 20 nm in thickness and a titanium nitride film 24 of approximately 70 nm in thickness were formed according to a direct-current magnetron sputtering method. Subsequently, a blanket W film 32 of approximately 600 nm in thickness was formed in accordance with a thermal CVD method using a mixed gas of tungsten hexafluoride ($WF_6$) and hydrogen gases. As shown in FIG. 7A, prior to CMP treatment, the W film 32 had the protruding and depressed portions reflecting the similarly formed portions of the substrate, silicon oxide film 22.

To the substrate 12 thus formed, CMP was applied by using a polishing apparatus shown in FIG. 1. After unnecessary tungsten film 32 other than that placed in wiring trenches and opening holes for connecting wires was removed, buried W wiring portions and W plugs were formed. The polishing agent used in CMP were prepared by dispersing alumina grains (polishing grains) having an average grain diameter of 50 nm (1.0 wt.%) in an aqueous hydrogen peroxide solution (5 vol.%), followed by adding 0.4 g/l N-benzoyl-N-phenylhydroxylamine (chemical agent) to the above-obtained dispersion solution. The polishing was performed at a polishing pressure of 300 gf/cm$^2$, by setting each of the revolution rates of the polishing table 14 and vacuum chuck holder 11 to 100 rpm while maintaining the polishing table at a constant room temperature of 25° C.

As a result, CMP was performed at an extremely high polishing rate of approximately 300 nm/min. To form buried W-wiring portions and W plugs, it is necessary to remove not only W film 32 but also the titanium film 31 and titanium nitride film 24. These films 31 and 24 were removed at the same rate, approximately 300 nm/min as in removing W film 32. After CMP completion, the surfaces of the buried W-wiring portions, W plugs and exposed silicon oxide film were observed by a scanning electron microscope. No scratches were observed thereon in this CMP process.

W, WOx and the like were presumably co-present on the W surface during CMP. However, a protection film was formed since BPA made a chelate compound with any one of the substances present in the W surface.

Figure 8:
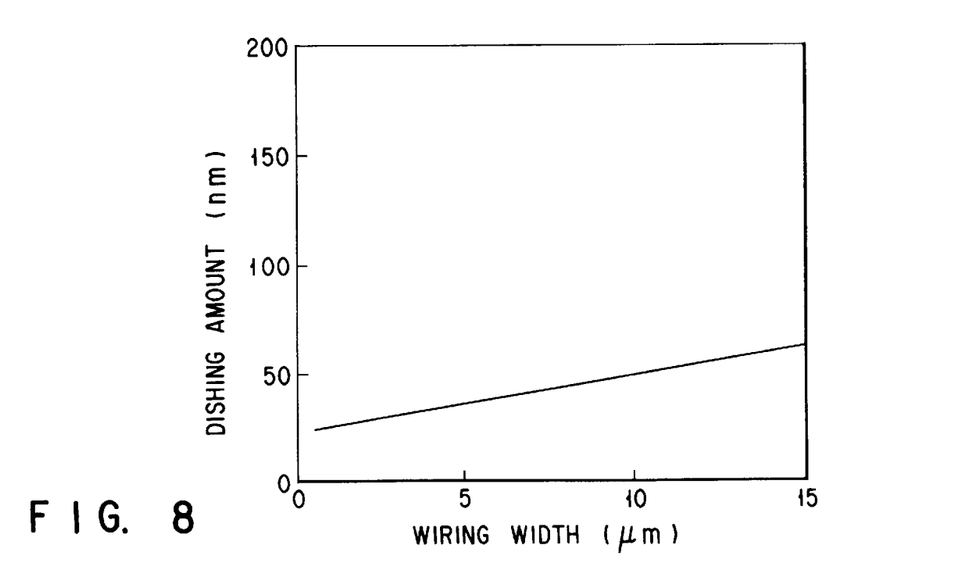

We checked the dependency of dishing amount on wiring width. The results are shown in FIG. 8. The polishing was regarded as having been completed at the time when the W film 32, the titanium film 31 and titanium nitride film 24 were completely removed. As is apparent from FIG. 8, the dishing amount of the buried W-wiring portions is approximately 50 nm at the central portion of the wiring of 10 μm in width. This dishing amount was a practically acceptable value. When the polishing time was further extended, the dishing value hardly increased. Taking this fact into consideration, it can be determined that the protection film formed on the W film 32 effectively functions.

In this Example, we explain the case where a W film was polished, but the similar effect can be obtained even if the W film is contaminated with a small amount of impurities and additional elements.

In the aforementioned Example, we explain the case where the W film was formed like a blanket. However, the present invention can be applied to the case where the W film is allowed to grow selectively using a mixed gas of $WF_6$ and $SiH_4$ gases or a gas formed by adding an $H_2$ gas to this mixed gas.

To be more specific, when the W film is formed selectively on a silicon layer, a TiN layer, or a silicide layer such as a TiSi layer, which is disclosed in the bottom of contact holes and via holes formed in an interlayer insulating film, the W particles are accidentally grown on the surface of the insulating film due to failure in selectivity. In this case, if the polishing method of this Example is used, the W particles grown on the surface of the insulating film can be selectively removed.

In this Example, we explain the cases where alumina grains alone were used as the polishing grains but the similar effect can be obtained even if use is made of grains having equal to or higher hardness than that of alumina grains such as silica grains, titanium oxide grains, zirconium oxide grains, cerium oxide grains, silicone carbide grains, and diamond grains.

In this Example, we explain the case where an aqueous hydrogen peroxide solution was used as an etching agent and BPA as a chemical agent, but the similar effect can be obtained even if use is made of an aqueous iron nitrate solution, a mixed aqueous solution containing potassium ferricyanide and ethylenediamine, a mixed aqueous solution of potassium ferricyanide and phosphoric acid, and the like. Furthermore, the similar effect can be obtained even if use is made of a chemical agent such as various BTA derivatives, specific to a film-forming material to be etched and capable of forming a chelate compound or a complex with the film-forming material.

In this Example, a polishing pad made of a resin-impregnated nonwoven fabric was used but any polishing pad may be used as long as it has approximately the same hardness as that of the polishing pad used in the present invention. For example, a pad made of nonwoven fabric such as polyester or polyether and an expanded polyurethane pad may be used. Two or more different non woven fabrics can be adhered to form a pad. It should be noted that as the BTA derivative mentioned above, BTA whose hydrogen portion is substituted by an alkyl group (methyl group, ethyl group), is particularly preferable.

(Comparative Example 2)

CMP was applied to the substrate 12 to be polished shown in FIG. 7A in the same manner as in Example 2 except that use was made of a polishing agent formed by dispersing alumina grains (polishing grains) having an average diameter of 50 nm (1.0 wt%) in an aqueous hydrogen peroxide solution (5 vol.%). In other words, the polishing agent was the same polishing grains used in Example 2 except that BPA was not added.

Figure 9:
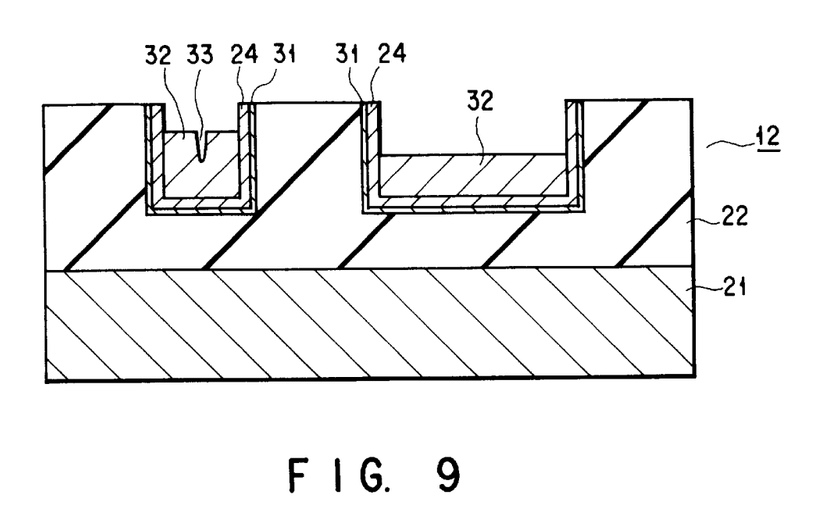
FIG. 9 is a sectional view explaining a conventional polishing method.

As a result, CMP was performed at an extremely high polishing rate of approximately 350 nm/min. The dishing value was extremely large compared to that in Example 2. As shown in FIG. 9, the dishing amount was approximately 200 nm at minimum wiring width of 0.4 μm. Furthermore, etching proceeded along a joint formed at the center wiring portion of the W film during thermal CVD, with the result that a hole 33 was created in the wiring.

(EXAMPLE 3)

In the polishing method of the present invention, a protection film made of a metal (e.g., Cu) and a chemical agent (e.g., BTA) is formed on the metal (Cu) surface during metal polishing. Upon the completion of mechanical removal of the protection film, Cu etching is started by an etching component contained in the polishing agent. Activating energy $E_{ae}$ for increasing Cu-etching rate is relatively large while activating energy $E_{ap}$ for increasing Cu polishing rate is relatively small, since polishing is carried out by not only a chemical action but also a mechanical action. Hence, the following relationship is obtained:

$E_{ae} > E_{ap}$.

Since a ratio of a polishing rate relative to an etching rate becomes larger as temperature decreases, it is rather advantageous to perform CMP at low temperature in order to decrease dishing.

Hereinafter, for the above-mentioned reasons, we will explain the case where CMP performed at low temperature. When CMP is carried out at low temperature of, for example, 20° C. or less, at least one item selecting from a polishing table, a polishing pad and a polishing agent may be cooled, and alternatively, the following method may be employed. That is, a first polishing step is performed at normal temperature, and subsequently a second polishing step at low temperature of 20° C. or less.

CMP was applied to a substrate 12 to be polished shown in FIG. 2A by using a polishing apparatus shown in FIG. 1. and unnecessary Cu film 25 other than that in wiring trenches and in open holes for contacting wires, was removed, thereby forming buried Cu-wiring portions and Cu plugs. The polishing agent used in CMP was prepared by dispersing silica grains (polishing grains) having an average diameter of 30 nm (5.3 wt%) in a mixed solution (a Cu etching solution) of 0.12 mole/l aqueous glycine solution and 0.44 mole/l aqueous hydrogen peroxide solution, followed by adding 0.001 mole/l benzotriazole ($C_6H_5N_3$) serving as a chemical agent thereto. The polishing was performed at a polishing pressure of 400 gf/cm$^2$, each of the revolution rates of the polishing table 14 and vacuum chuck holder 11 was set to 60 rpm.

Figure 10:
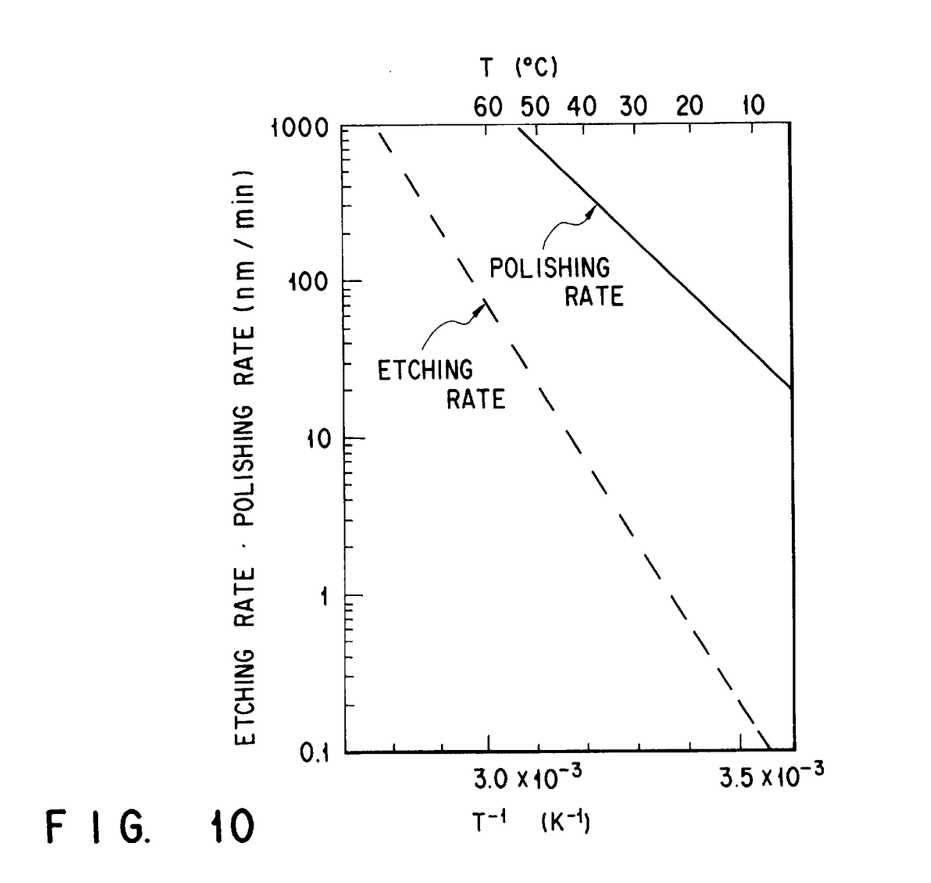
FIG. 10 is a graph showing the temperature dependency of the polishing rate and the etching rate in the present invention.

The dependency of the Cu-polishing rate and Cu etching rate on temperature was checked by varying temperature within the range of approximately −2° C. to 100° C. The results are shown in FIG. 10. As is apparent from FIG. 10, the polishing rate and etching rate are proportional to exponentials of the inverse numbers (1/T) of the temperatures. Then, activation energy $E_{ap}$ for the polishing rate and activation energy $E_{ae}$ for the etching rate were respectively obtained from the gradient of the graphs shown in FIG. 10. $E_{ap}$ and $E_{ae}$ were approximately 0.7 eV and 0.9 eV, respectively. Since the graphs have a negative gradient and $E_{ap}$ is smaller than $E_{ae}$, the ratio of a polishing rate to an etching rate increases as temperature decreases. Hence, the dishing amount of the Cu-wiring decreases as the CMP temperature decreases.

Figure 11:
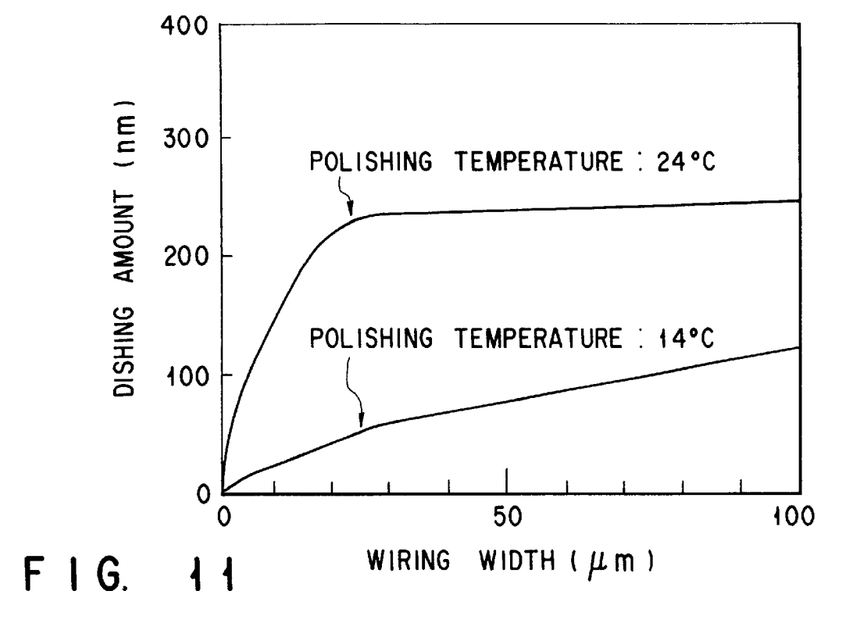

Subsequently, we checked the dependency of the dishing amount upon wiring width in each of the cases where CMP was carried out at room temperature (24° C.) and at 14° C. The results are shown in FIG. 11. The polishing was regarded as having been completed at the time when the Cu film 25 and titanium nitride film 24 were completely removed. As is apparent from FIG. 11, the dishing value of the buried Cu-wiring portions is approximately 100 nm at the central portion of the wiring of 10 μm in width. This dishing value is practically acceptable.

Figure 12:
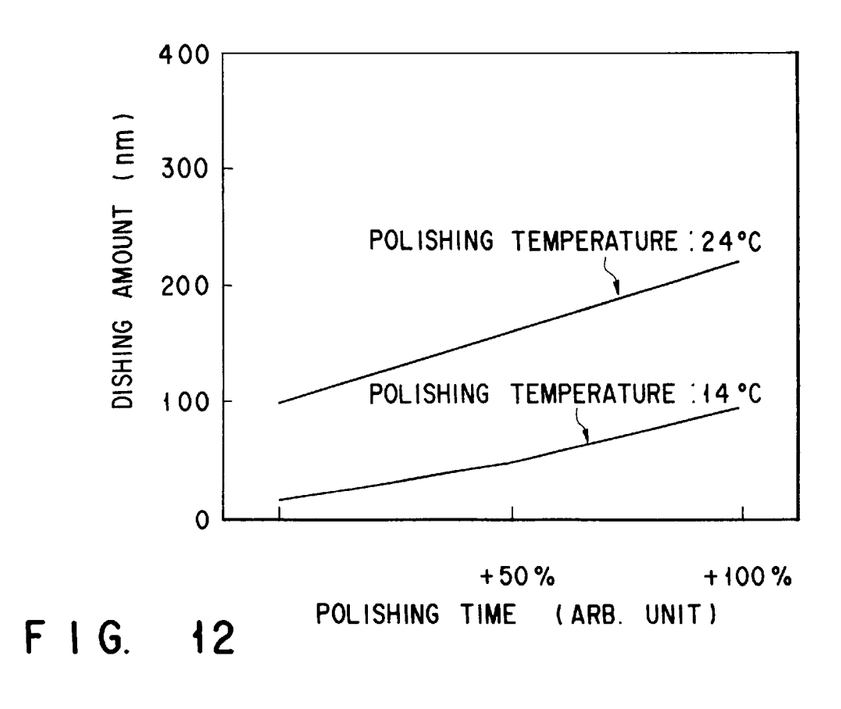
FIG. 12 is a graph showing the relationship between the dishing amount and the polishing time in the polishing method of the present invention.

The dependency of the dishing amount at wiring width 5 μm upon polishing time was checked individually in the cases where CMP was carried out at room temperature (24° C.) and at 14° C., separately. The results are shown in FIG. 12. As is apparent from FIG. 12, when CMP is carried out at low temperature, an increase in dishing amount caused by overpolishing can be suppressed.

After CMP completion, the surfaces of the buried Cu-wiring portions and Cu plugs were observed by a scanning electron microscope. No scratches were observed thereon in this CMP process.

In this Example, we explain the case where a Cu film was polished but the similar effect can be obtained even if use is made of the Cu film contaminated with a small amount of impurities and additional elements, the film made of metal other than Cu, such as Ag, Al, or W, or the film consisting of any one of the aforementioned metals as a main component.

In this Example, we explain the case where silica grains alone were used as the polishing grains but the similar effect can be obtained even if use is made of grains having the equal to or more higher hardness as that of silica grains, such as alumina grains, titanium oxide grains, zirconium oxide grains, cerium grains, silicone carbide grains, and diamond grains.

In this Example, we explain the case where a mixed solution of an aqueous glycine solution and a hydrogen peroxide solution was used as an etching agent and BTA as a chemical agent, but the similar effect can be obtained even if use is made of an etching solution consisting of a mixed acid (amidosulfuric acid+an aminoacetic acid) and an oxidizing agent such as hydrogen peroxide ($H_2O_2$) nitric acid, hypochlorous acid, or ozone water, or if use is made of ammonium nitride, ammonium chloride, or chromic acid. Furthermore, the similar effect can be obtained even if as the chemical agent specific to a film material to be etched, use is made of an agent capable of forming a chelate compound or a complex with the film material, such as various BTA derivatives, a mixture containing various BTA derivatives, thiourea, thiourea derivatives, cupferron, benzimidazole, triazole, salicylaldoxime, ethylenediamine, cysteine, p-aminobenzaldehyde, halo acetic acid, dodecylmercaptan phosphonic acids, or monosaccharides including a glucose and a fructose. It is particularly effective that BTA or a BTA derivative is used together with an aqueous sulfuric acid solution or an aqueous hydrochloric acid solution.

In this Example, a polishing pad consisting of resin-impregnated nonwoven fabric was used but any polishing pad may be used as long as it has the same hardness as the polishing pad used in the present invention. For example, a pad made of nonwoven fabric such as polyester or polyether and an expanded polyurethane pad may be used. Two or more different non woven fabrics mentioned above can be adhered to form a pad. It should be noted that as the BTA derivative mentioned above, BTA whose hydrogen portion is substituted by an alkyl group is particularly preferable.

(EXAMPLE 4)

Figure 13:
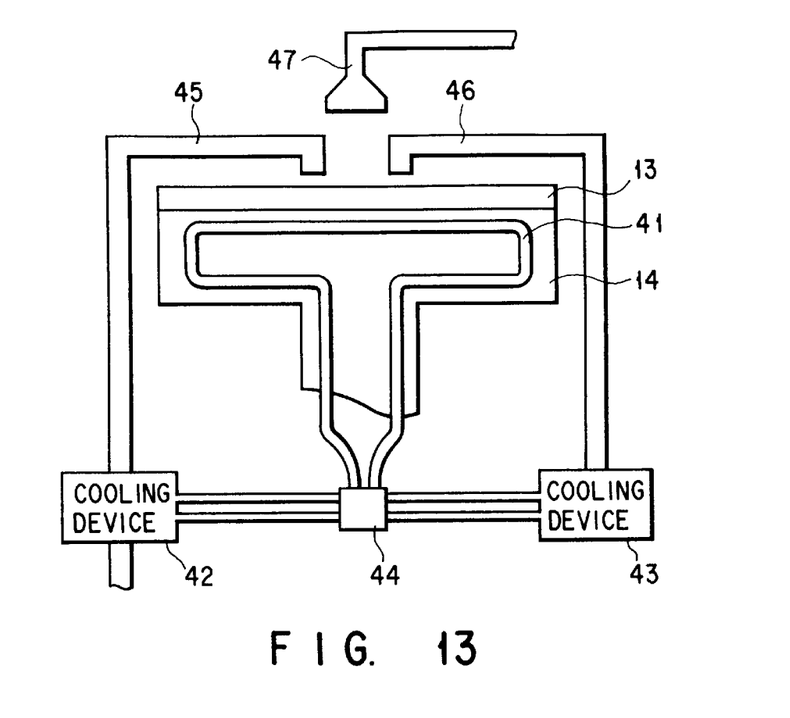
FIG. 13 is a schematic view showing part of the polishing apparatus to be used in the polishing method of the present invention.

FIG. 13 is a schematic view showing a polishing apparatus used in the polishing method of the present invention. In this polishing apparatus, a coolant circulation path 41 is provided to the polishing table 14. In the coolant circulation path 41, a coolant such as water or ethylene glycol is allowed to flow to control the temperature of the polishing table 14 and a polishing pad 13. The polishing table 14 is mainly formed of glass fiber. Since the glass fiber has a smaller thermal capacity and a larger heat conductivity than those of metal material, the temperature of the polishing table 14 can be controlled immediately. The coolant circulation path 41 is connected to two coolant cooling device systems (cooling device 42 and 43). The route of coolant circulation can be changed any time by a switch 44. In addition, polishing agent supply systems 45 and 46 are connected to the cooling devices 42 and 43 respectively to control the temperature of the polishing agent to be supplied. Above the polishing table 14, a jet nozzle 47 is disposed, which is used for blowing cooled pure water upon the polishing table 14.

Using the polishing apparatus having the aforementioned structures, two-step CMP was carried out. The two-step CMP included a first polishing step performed at room temperature and a second polishing step performed at low temperature. The temperatures of the cooling devices 42 and 43 were set to 24.0° C. and to 14.0° C., respectively. Consequently, the temperatures of a polishing agent supply system 45 and polishing agent in the supply system were set to 24.0° C. Similarly, the temperatures of a polishing agent supply system 46 and polishing agent in the supply system were set to 14.0° C. Furthermore, the temperature of pure water in the jet nozzle 47 was set to 14.0° C.

In the first step, CMP was carried out in the same manner as in Example 3, using the polishing agent supply system 45 at 24° C. by connecting the coolant circulation path 41 in the polishing table 14 to a coolant device 42 by the switch 44. At this time, polishing was performed for a certain period of time which was 80% shorter than that required for complete polishing. More specifically, the first polishing was carried out for 2 minutes and 5 seconds since the time required for complete polishing was 2 minutes 37 seconds.

Upon completion of the first polishing, the polishing agent supply system 45 was shut off and then the coolant circulation path 41 for cooling the polishing table 14 was connected to the cooling device 43 by the switch 44. By this operation, cooling water (14° C.) was immediately circulated in the polishing table 14. Simultaneously, cooled pure water was allowed to spray from the jet nozzle 47 to cool the polishing table 14. After the surface temperature of the polishing pad 13 mounted on the polishing table 14 reached approximately 14° C., the polishing temperature was set to 14.0° C. by using the polishing agent supply system 46. Then, the second step CMP was carried out in the same manner as in Example 3. The portion remained unpolished in the first polishing was completely polished by the second-step polishing. It took 2 minutes and 24 seconds.

Figure 14:
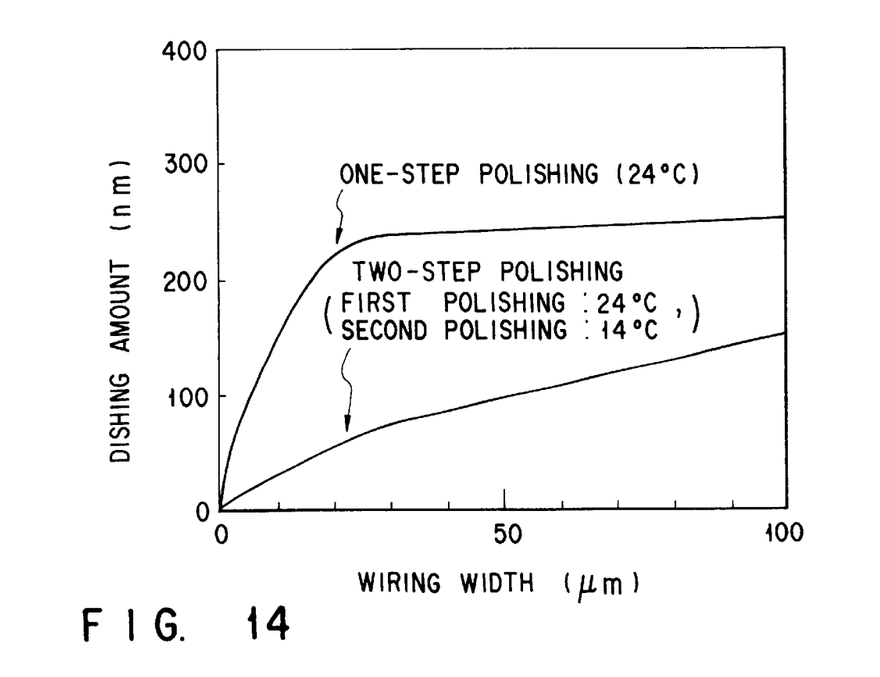

We checked the dependency of the dishing amount upon the wiring width in the polished Cu-wiring portions. The results are shown in FIG. 14. As is apparent from FIG. 14, the dishing was efficiently suppressed in the second-step CMP to the same level as that in one-step CMP performed at low temperature.

As explained in the foregoing, the CMP method of the present invention, which uses the polishing agent consisting of a chemical agent responsible for forming a protection film on a film surface made of metal-dominant material so as to fill the depressed portions of the film surface, by reacting with the metal-dominant material, and an etching agent for the metal-dominant material, enables to form a conductive film in the depressed portions while substantially suppressing dishing and scratches, thereby providing a highly reliable conductive film in short time.

Additional advantages and modifications will readily occur to those skilled in the art. Therefore, the invention in its broader aspects is not limited to the specific details, representative agents, and illustrated examples shown and described herein. Accordingly, various modifications may be made without departing from the spirit or scope of the general inventive concept as defined by the appended claims and their equivalents.

What is claimed is:

1. A polishing method comprising the steps of:
   forming a film made of material containing a metal as a main component over a substrate having depressed portions on a surface thereof so as to fill said depressed portions with said film; and
   polishing said film by a chemical mechanical polishing method using a polishing agent containing a chemical agent and an etching agent, said chemical agent being responsible for forming a protection film on the surface of said film by reacting with said material containing a metal as a main component, and said etching agent being for etching said material containing a metal as a main component,
   thereby forming a conductive film in said depressed portions,
   wherein said metal is Cu or a Cu alloy and said etching agent includes either aminoacetic acid or amidosulfuric acid, and an oxidizing agent and water.

2. The method according to claim 1, wherein said chemical agent include at least benzotriazole or a derivative thereof.

3. The method according to claim 2, wherein said etching agent contains aminoacetic acid or amidosulfuric and an oxidizing agent in a mixing ratio which is controlled so as to etch material containing Cu as a main component at a rate of at least 10 nm/minute.

4. The method according to claim 2, wherein the molar concentration ratio of said chemical agent to aminoacetic acid or amidosulfuric acid in said etching agent falls within the range of 1/1000 to 3/100.

5. A polishing method comprising the steps of:
   forming a film made of material containing a metal as a main component over a substrate having depressed portions on a surface thereof so as to fill said depressed portions with said film;
   polishing said film by a chemical mechanical polishing method using a first polishing agent containing an etching agent for said material containing a metal as a main component; and
   polishing said film by a chemical mechanical polishing method using a second polishing agent containing said first polishing agent and a chemical agent responsible for forming a protection film on a surface of said film by reacting with said material containing a metal as a main component,
   thereby forming a conductive film in said depressed portions.

6. The method according to claim 5, wherein said metal is Cu or a Cu alloy and an etching agent includes aminoacetic acid or amidosulfuric acid, an oxidizing agent and water.

7. The method according to claim 6, wherein a said chemical agent includes at least benzotriazole or a derivative thereof.

8. The method according to claim 6, wherein said etching agent contains aminoacetic acid or amidosulfuric acid and an oxidizing agent in a mixing ratio which is controlled so as to etch material containing Cu as a main component at a rate of at least 10 nm/minute.

9. The method according to claim 6, wherein the molar concentration ratio of said chemical agent to aminoacetic acid or amidosulfuric acid in said etching agent falls within the range of 1/1000 to 3/100.

10. A polishing method, comprising the steps of:
    forming a conductive film made of a material containing a metal as a main component on a substrate having depressed portions on a surface thereof, so as to fill said depressed portions with said conductive film to form a depressed surface of said conductive film; and
    chemically and mechanically polishing said conductive film by applying a slurry comprising a polishing agent containing a chemical agent which forms a protective film on the depressed surfaces of said conductive film by reaction with said material containing a metal as a main component in combination with aminoacetic acid or amidosulfuric acid, and hydrogen peroxide, the molar concentration ratio of said chemical agent to aminoacetic acid or amidosulfuric acid in said polishing agent falling within the range of 1/1000 to 3/100.

11. The method according to claim 10, wherein a said chemical agent includes at least benzotriazole or a derivative thereof.

12. The method according to claim 10, wherein said metal is W or a W alloy and said chemical agent includes at least N-benzoyl-N-phenylhydroxylamine or a derivative thereof.

13. The method according to claim 10, wherein said metal is Cu or a Cu alloy.

14. The method according to claim 13 wherein aminoacetic acid or amidosulfuric acid and an oxidizing agent are present in a mixing ratio which is controlled so as to etch material containing Cu as a main component at a rate of at least 10 nm/minute.

15. A polishing method, comprising the steps of:

forming a conductive film made of a material containing a metal as a main component on a substrate having depressed portions on a surface thereof, so as to fill said depressed portions with said conductive film to form a depressed surface of said conductive film; and chemically and mechanically polishing said conductive film using a polishing pad attached to a polishing table while applying a slurry comprising a polishing agent containing a chemical agent which forms a protective film on the depressed surfaces of said conductive film by reaction with said material containing a metal as a main component in combination with aminoacetic acid, amidosulfuric acid, or hydrogen peroxide, said polishing being performed while cooling at least one member selected from the group consisting of the polishing pad, the polishing table and the slurry.

* * * * *